United States Patent
Goodrich et al.

(10) Patent No.: US 7,282,923 B2
(45) Date of Patent: Oct. 16, 2007

(54) SYSTEMS AND METHODS FOR TRIGGERING A PARTIAL DISCHARGE ACQUISITION

(75) Inventors: Gregory John Goodrich, Scotia, NY (US); James Clark Powzyk, Schenectady, NY (US); Steven Glenn Ostrander, Schenectady, NY (US); Kotesh Kummamuri Rao, Pearland, TX (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/230,982

(22) Filed: Sep. 20, 2005

(65) Prior Publication Data

US 2007/0063709 A1    Mar. 22, 2007

(51) Int. Cl.
*H01H 9/50* (2006.01)
*G01R 17/16* (2006.01)

(52) U.S. Cl. .................... 324/536; 324/76.65
(58) Field of Classification Search ............ 324/536, 324/76.65
See application file for complete search history.

(56) References Cited

U.S. PATENT DOCUMENTS

| | | | |
|---|---|---|---|
| 4,761,703 A | 8/1988 | Kliman et al. | |
| 5,247,258 A * | 9/1993 | Tripier et al. | 324/536 |
| 5,828,227 A * | 10/1998 | Shiota et al. | 324/772 |
| 6,064,172 A | 5/2000 | Kuznetsov | |
| 6,088,658 A | 7/2000 | Yazici et al. | |
| 6,345,236 B1 | 2/2002 | Bertheau et al. | |
| 6,452,416 B1 * | 9/2002 | Kaneda et al. | 324/772 |
| 6,573,727 B2 * | 6/2003 | Krahn et al. | 324/536 |
| 6,798,107 B2 | 9/2004 | Leijon | |
| 6,798,210 B2 | 9/2004 | Goodrich et al. | |
| 6,911,838 B2 | 6/2005 | Rao et al. | |
| 2004/0263179 A1 | 12/2004 | Ahmed et al. | |
| 2005/0012507 A1* | 1/2005 | Kaneda et al. | 324/536 |
| 2005/0035768 A1 | 2/2005 | Rabach et al. | |

* cited by examiner

*Primary Examiner*—Anjan Deb
*Assistant Examiner*—Jeff Natalini
(74) *Attorney, Agent, or Firm*—Armstrong Teasdale LLP

(57) ABSTRACT

A method for triggering a partial discharge acquisition from an energy generating device is described. The method includes generating a power source sensed signal by sensing electromagnetic energy output from the energy generating device, producing an present flux density trace from the power source sensed signal, and determining a lack of variation in timing from at least one of the present flux density trace and a comparison between the present flux density trace and at least one prior flux density trace.

20 Claims, 4 Drawing Sheets

SYSTEMS AND METHODS FOR TRIGGERING A PARTIAL DISCHARGE ACQUISITION

BACKGROUND OF THE INVENTION

This invention relates generally to power systems and more particularly to systems and methods for triggering a partial discharge (PD) acquisition from power systems.

PD analysis has been established as a useful diagnostic tool to assess high voltage insulation systems for integrity and design deficiencies. Interpretation of a PD pattern can reveal a source and/or an underlying cause for an occurrence of the PD pattern, and therefore, has been used as a condition monitoring and quality control tool by the manufacturing industry. Moreover, it is known to perform a PD analysis for high voltage electrical equipment and more particularly, for insulation systems encountered in high voltage rotating machinery. Typically, high voltage insulation is a heterogeneous composite including tape, mica flakes, and resin. As is known, no insulation system is homogeneously perfect and there is a statistical distribution of voids and other defects throughout known insulation systems. The void distribution results in a baseline level of PD activity for all insulation systems. An associated discharge of energy due to a defect in the insulation system is often a complicated and multi-faceted event studied from the PD pattern.

Users of the high voltage electrical equipment may incur extraordinary expenses when the equipment unexpectedly fails. An ability to predict failures of the equipment caused by defects in the insulation system enables an equipment user to utilize condition-based maintenance techniques to facilitate averting such unexpected failures and associated high costs. As such, within at least some known systems, the insulation system is monitored during operation of high voltage equipment to predict when a catastrophic defect will occur to avoid excessive damage, and to avoid unexpected and costly repair caused by the defect of the high voltage electrical equipment.

However, known automated monitoring systems of the insulation system may be impracticable because of PD data manipulation problems, such as, information overload caused by the partial discharge pattern. As such, identification of defective high voltage electrical equipment by using the PD analysis is generally not performed in an efficient and economic manner.

BRIEF DESCRIPTION OF THE INVENTION

In one aspect, a method for triggering a partial discharge acquisition from an energy generating device is described. The method includes generating a power source sensed signal by sensing electromagnetic energy output from the energy generating device, producing a present flux density trace from the power source sensed signal, and determining a lack of variation in timing from at least one of the present flux density trace and a comparison between the present flux density trace and at least one prior flux density trace.

In another aspect, a system for triggering a partial discharge acquisition from an energy generating device is described. The system includes a sensor configured to generate a power source sensed signal by sensing electromagnetic energy output from the energy generating device. The system also includes a processor configured to produce a present flux density trace from the power source sensed signal. The processor is configured to detect a lack of variation in timing from at least one of the present flux density trace and a comparison between the present flux density trace and a prior flux density trace.

In yet another aspect, a processor is provided. The processor is configured to activate a partial data acquisition unit based on a lack of variation in timing, the lack of variation generated from at least one of a present flux density trace and a comparison between the present flux density trace and a prior flux density trace.

DETAILED DESCRIPTION OF THE INVENTION

Figure 1:
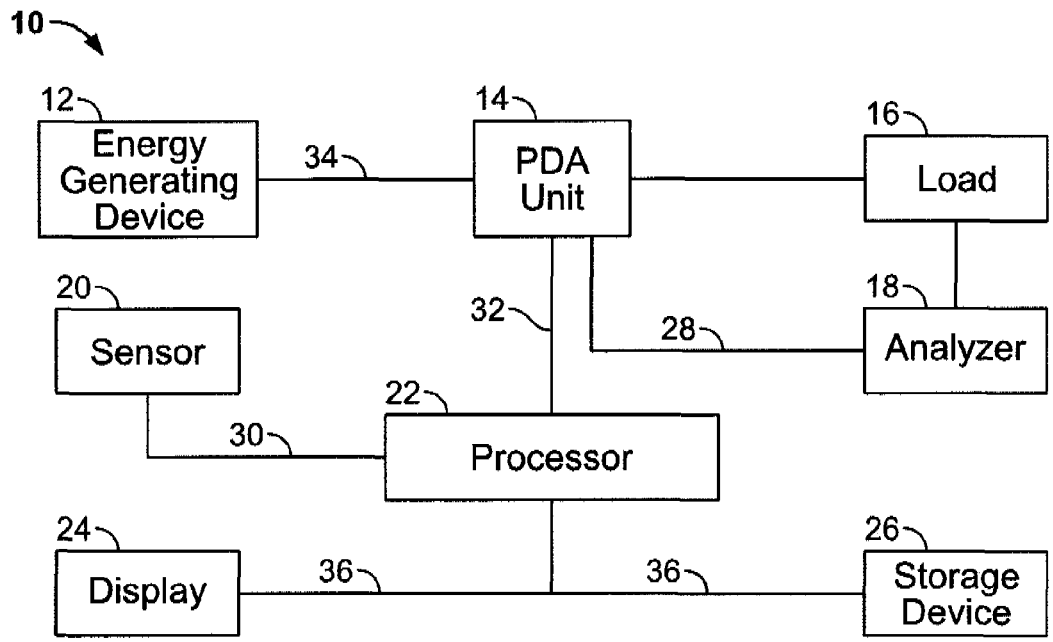
FIG. 1 is a block diagram of a system for triggering a partial discharge acquisition.

FIG. 1 is a block diagram of a system 10 for triggering a partial discharge acquisition (PDA). System 10 includes an energy generating device (EGD) 12, a PDA unit 14, a load 16, an analyzer 18, a sensor 20, a processor 22, a display 24, and a storage device 26. In an alternative embodiment, analyzer 18 is located within PDA unit 14. PDA unit 14 is coupled to EGD 12 via a multi-phase line, such as a three-phase line. Examples of EGD 12 include an alternating current (AC) rotating machine, such as a motor, and a synchronous dynamo-electric machine, such as a turbine generator. As another example, EGD 12 employs an interaction of magnetic fields to produce electric power. As yet another example, EGD 12 is powered by a high voltage source, such as a power source generating between 5 kilovolts and 10 kilovolts. In an alternative embodiment, EGD 12 is replaced by a power device, such as a step-up transformer or alternatively a high-yard backup generator. PDA unit 14 may be a PDA device, such as a partial discharge detector, ICMsystem™, available from Power Diagnostix Systems GmbH™ Corporation or alternatively a partial discharge detector, PDBase® system, available from TECHIMP™ Corporation. As used herein, processor is not limited to integrated circuits referred to in the art as a computer, but broadly refers to a microcontroller, a microcomputer, a microprocessor, a programmable logic controller, an application specific integrated circuit, and other programmable circuits, among others.

Analyzer 18 may be a spectrum analyzer that converts a partial discharge information signal 28 received from sensor 20 from a time domain to a frequency domain. The spectrum analyzer converts partial discharge information signal 28 from the time domain into the frequency domain by applying a transform, such as a Fourier transform. An example of load 16 includes a pressure regulator and a voltage regulator. Display 24 can be a cathode ray tube or alternatively a liquid crystal display. Examples of storage device 26 include a volatile memory, such as, a random access memory (RAM), a non-volatile memory, such as, a read-only memory (ROM)

and a RAM powered with a battery. Other examples of the non-volatile memory include a hard disk, a digital versatile disc (DVD), a compact disc rewriteable (CD-RW), and a memory stick. Examples of the ROM include a programmable ROM (PROM), an erasable programmable ROM, and an electrically erasable PROM (EEPROM).

EGD 12 receives a high voltage to generate electromagnetic energy. Sensor 20 detects electromagnetic energy generated by EGD 12 and converts the electromagnetic energy into a power source sensed signal 30. In another alternative embodiment, an additional sensor, such as sensor 20, detects electromagnetic energy generated by the power device that is located downstream from EGD 12 towards load 16. The additional sensor detects electromagnetic energy to generate power source sensed signal 30. Processor 22 receives power source sensed signal 30 and applies a method for triggering a PDA to power source sensed signal 30 to generate a processor output signal 32 that is provided to control PDA unit 14. Upon activation, PDA unit 14 detects operation data 34 showing whether there is a partial discharge of energy within a portion, such as an insulation material, of EGD 12. PDA unit 14 detects operation data 34 to output partial discharge information signal 28. Analyzer 18 receives partial discharge information signal 28 and load parameters, such as megawatts (MW) and megavoltage-ampere-reactive (MVAR), of load 16. Partial discharge information signal 28 and the load parameters can be viewed by an operator to determine whether a partial discharge within EGD 12 needs immediate attention or alternative can be attended to at a later time. In an alternative embodiment, partial discharge information signal 28 and the load parameters can be viewed by the operator to determine whether a partial discharge within the power device needs immediate attention or alternative can be attended to at a later time. Operation data 34 is stored in storage device 26.

Processor 22 converts processor output signal 32 from an analog form into a digital form to generate processor output data 36, which can be displayed on display 24 and/or stored in storage device 26. EGD 12 is under normal operation and/or online when electromagnetic energy is delivered from EGD 12 to load 16.

Figure 2:
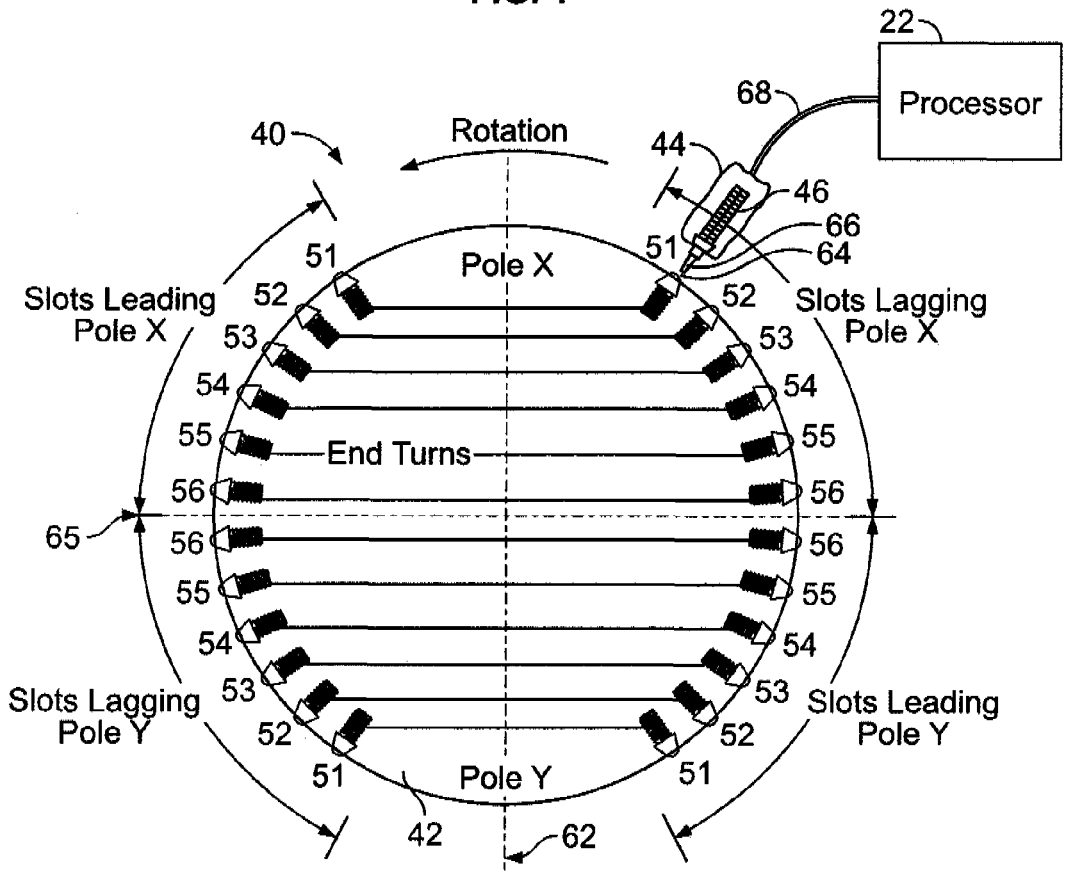
FIG. 2 is a cross-sectional view of an embodiment of a synchronous dynamo-electric machine located within the system of FIG. 1.

FIG. 2 is a cross-sectional view of an embodiment of a synchronous dynamo-electric machine 40 such as, for example, a turbine-generator, that employs an interaction of magnetic fields between a rotor 42 and a stator 44 to produce electromagnetic energy. Synchronous dynamo-electric machine 40 is an example of EGD 12. When a voltage source (not shown) is coupled to synchronous dynamo-electric machine 40, an AC output power is generated in an armature winding 46 of stator 44. A plurality of field windings 51-56 of coils on rotor 42 are excited by a direct current (DC) field supply. The DC field supply is generated either by an external DC exciter generator (not shown) and fed through a plurality of slip rings (not shown) to field windings 51-56, or in a brushless generator-rectifier assembly (not shown) rotating with rotor 42.

Rotor 42 has poles X and Y formed by an arrangement of a plurality of lateral slots that contain field windings 51-56 and by interconnecting field windings 51-56 with a plurality of end turns. In an alternative embodiment, synchronous dynamo-electric machine 40 may include more than two, such as, four or six, poles. Field windings 51-56 are symmetrically arranged in the slots with respect to a pole axis 62 and form an annular array around rotor 42. A quadrature axis 65 is perpendicular to pole axis 62.

An annular air-gap 64 separates field windings 51-56 from armature winding 46 of stator 44. A flux probe 66, which is an example of sensor 20, may extend radially through stator 44 and into air-gap 64. Flux probe 66 may be permanently mounted in stator 44 or may be temporarily inserted into air-gap 64 between stator 44 and rotor 42. Flux probe 66 senses a rotor leakage flux, which is a form of electromagnetic energy generated by synchronous dynamo-electric machine 40. The rotor leakage flux is indicative of a movement of rotor 42 and, in particular, of an alternating passage of field windings 51-56 and the slots across a sensing field of flux probe 66. Flux probe 66 produces a voltage probe signal 68, which is an example of power source sensed signal 30. Voltage probe signal 68 is proportional to a rate of change of flux as rotor 42 turns. Voltage probe signal 68 is collected by processor 22 that executes method for triggering a PDA on voltage probe signal 68. Processor 22 may monitor in real time a voltage level of voltage probe signal 68.

Figure 3:
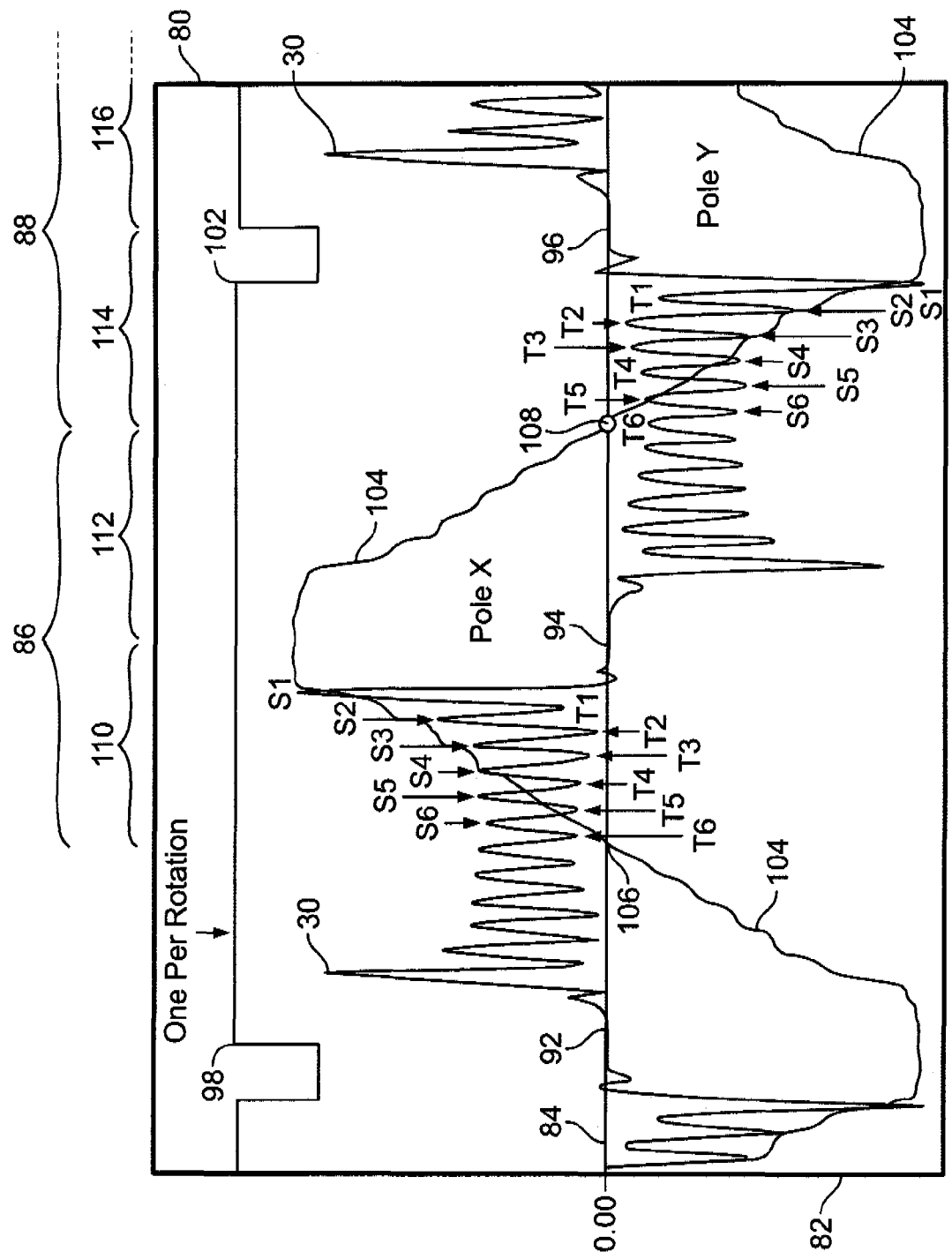
FIG. 3 is an exemplary graph generated by applying a method for detecting a rate of change of flux in the case of a synchronous AC rotating machine.

FIG. 3 is an exemplary graph 80 generated by applying a method for triggering a PDA from EGD 12. Method for determining partial discharge is executed during the normal operation of EGD 12. Graph 80 shows an amplitude of power source sensed signal 30 plotted on a y-axis 82 as a function of time plotted on an x-axis 84. A plurality of oscillations S1, S2, S3, S4, S5, S6, T1, T2, T3, T4, T5, and T6, encompassed within a group 86, are generated by processor 22 when flux probe 66 senses a leading edge of the pole X. For example, the oscillations S1 and T1 within group 86 are generated when flux probe 66 is closest to field winding 51 at the leading edge of the pole X than any other field windings 51-56 of poles X and Y. Similarly, a plurality of oscillations S1, S2, S3, S4, S5, S6, T1, T2, T3, T4, T5, and T6 encompassed within a group 88, are generated by processor 22 when flux probe 66 senses a leading edge of the pole Y. For example, the oscillations S2 and T2 within group 88 are generated when flux probe 66 is closest to field winding 52 at the leading edge of the pole Y than any other field windings 51-56 of the poles X and Y.

Power source sensed signal 30 shows voltage signal reversals indicated at points 92, 94, and 96 for one present rotation of rotor 42. The present rotation is indicated between points 98 and 102. Power source sensed signal 30 oscillates as flux probe 66 senses a passage of field windings 51-56 of rotor 42. During the present rotation of rotor 42, flux probe 66 senses the rotor leakage flux, in air-gap 64, produced by field windings 51-56 in the poles X and Y of rotor 42. The amplitude of power source sensed signal 30 during one present rotation of rotor 42 is proportional to a number of turns of field windings 51-56 of one of the slots and a magnitude of flux density of the rotor leakage flux in air-gap 64. The magnitude of the flux density increases at the leading edge, located from quadrature axis 65 to pole axis 62, of the pole X and progressively decreases towards quadrature axis 65 of the pole X. Similarly, the magnitude of the flux density increases at the leading edge, located from quadrature axis 65 to pole axis 62, of the pole Y and progressively decreases towards quadrature axis 65 of the pole Y.

Processor 22 integrates power source sensed signal 30 in real time to yield an present flux density trace 104. Processor 22 identifies a plurality of present times 106 and 108 at which a magnitude of present flux density trace 104 is equal to a pre-determined trace value. Examples of the pre-determined trace value include 0, 0.5, 1, and 2. Present time 106 occurs during the present rotation of rotor 42 and for the pole X. Present time 108 occurs during the present rotation of rotor 42 and for the pole Y. Present flux density trace 104 includes a pole X leading portion 110, a pole X lagging portion 112, a pole Y leading portion 114, and a pole Y lagging portion 116. Pole X leading portion 110 is generated when flux probe 66 senses electromagnetic energy from the leading edge of the pole X and pole X lagging portion 112 is generated when flux probe 66 senses electromagnetic energy from the lagging edge of the pole X. Pole Y leading portion 114 is generated when flux probe 66 senses electromagnetic energy from the leading edge of the pole Y, pole Y lagging portion 116 is generated when flux probe 66 senses electromagnetic energy from the lagging edge of the pole Y.

Figure 4:
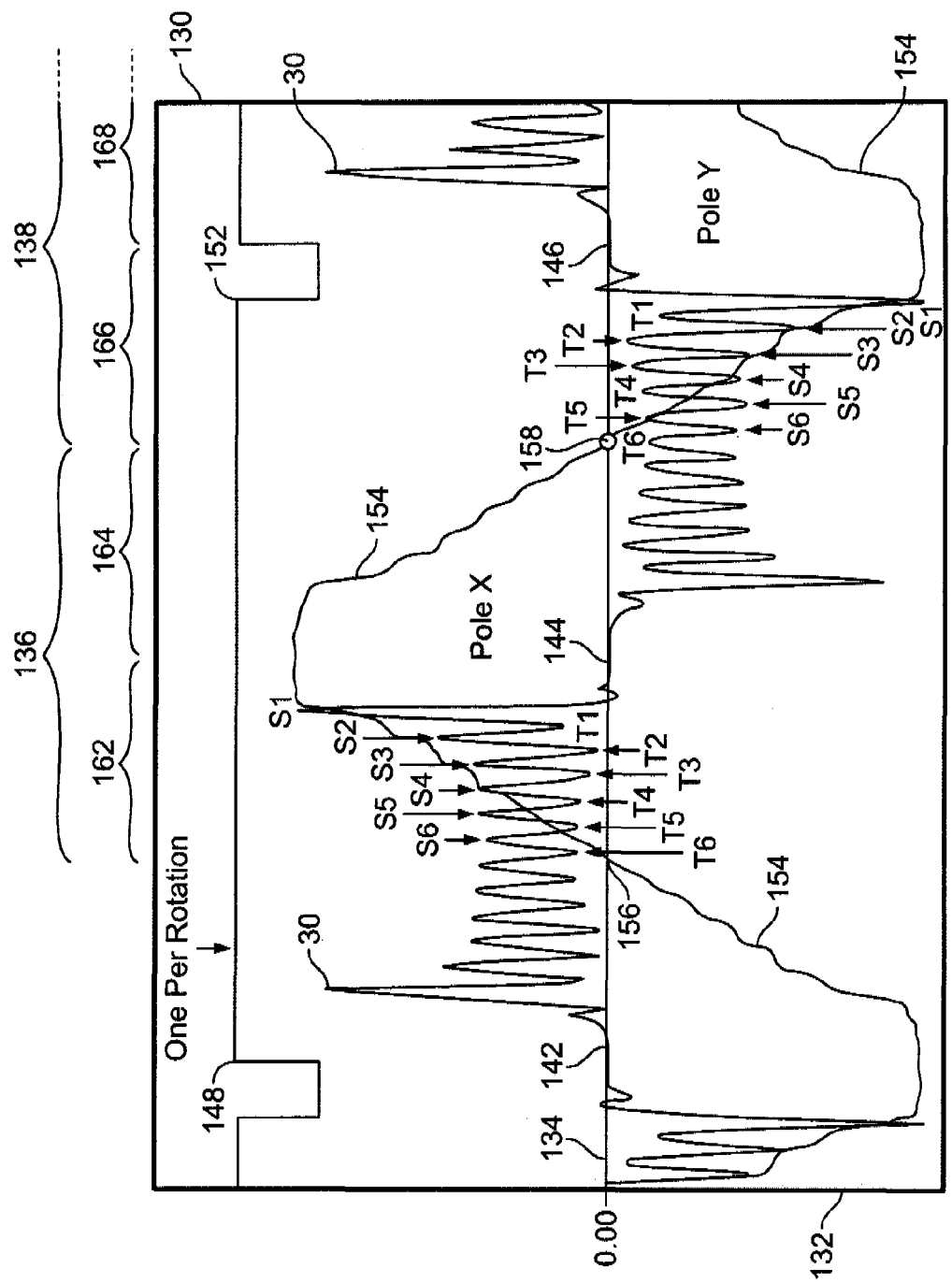
FIG. 4 is another exemplary graph generated to illustrate a method for triggering a partial discharge acquisition from the synchronous AC rotating machine.

FIG. 4 is an exemplary graph 130 generated by applying a method for triggering a PDA from EGD 12. Graph 130 shows an amplitude of power source sensed signal 30 plotted on a y-axis 132 as a function of time plotted on an x-axis 134. A plurality of oscillations S1, S2, S3, S4, S5, S6, T1, T2, T3, T4, T5, and T6, encompassed within a group 136, are generated by processor 22 when flux probe 66 senses the leading edge of the pole X. For example, the oscillations S3 and T3 within group 136 are generated when flux probe 66 is closest to field winding 53 at the leading edge of the pole X than any other field windings 51-56 of poles X and Y. Similarly, a plurality of oscillations S1, S2, S3, S4, S5, S6, T1, T2, T3, T4, T5, and T6 encompassed within a group 138, are generated by processor 22 when flux probe 66 senses the leading edge of the pole Y. For example, the oscillations S4 and T4 within group 138 are generated when flux probe 66 is closest to field winding 54 at the leading edge of the pole Y than any other field windings 51-56 of the poles X and Y.

Power source sensed signal 30 shows voltage signal reversals indicated at points 142, 144, and 146 for one prior rotation of rotor 42. The prior rotation is indicated between points 148 and 152. The prior rotation is prior in time than the present rotation. As an example, the prior rotation precedes the present rotation. During the prior rotation of rotor 42, flux probe 66 senses a flux, in air-gap 64, produced by field windings 51-56 in the poles X and Y of rotor 42.

Processor 22 integrates power source sensed signal 30 in real time to yield a prior flux density trace 154. Processor 22 identifies a plurality of prior times 156 and 158 at which a magnitude of prior flux density trace 154 is equal to the pre-determined trace value. Prior time 156 occurs during the prior rotation of rotor 42 and for the pole X. Prior time 158 occurs during the prior rotation of rotor 42 and for the pole Y. Prior flux density trace 154 includes a pole X leading portion 162, a pole X lagging portion 164, a pole Y leading portion 166, and a pole Y lagging portion 168. Pole X leading portion 162 is generated when flux probe 66 senses electromagnetic energy from the leading edge of the pole X and pole X lagging portion 164 is generated when flux probe 66 senses electromagnetic energy from the lagging edge of the pole X. Pole Y leading portion 166 is generated when flux probe 66 senses electromagnetic energy from the leading edge of the pole Y, pole Y lagging portion 168 is generated when flux probe 66 senses electromagnetic energy from the lagging edge of the pole Y.

Figure 5:
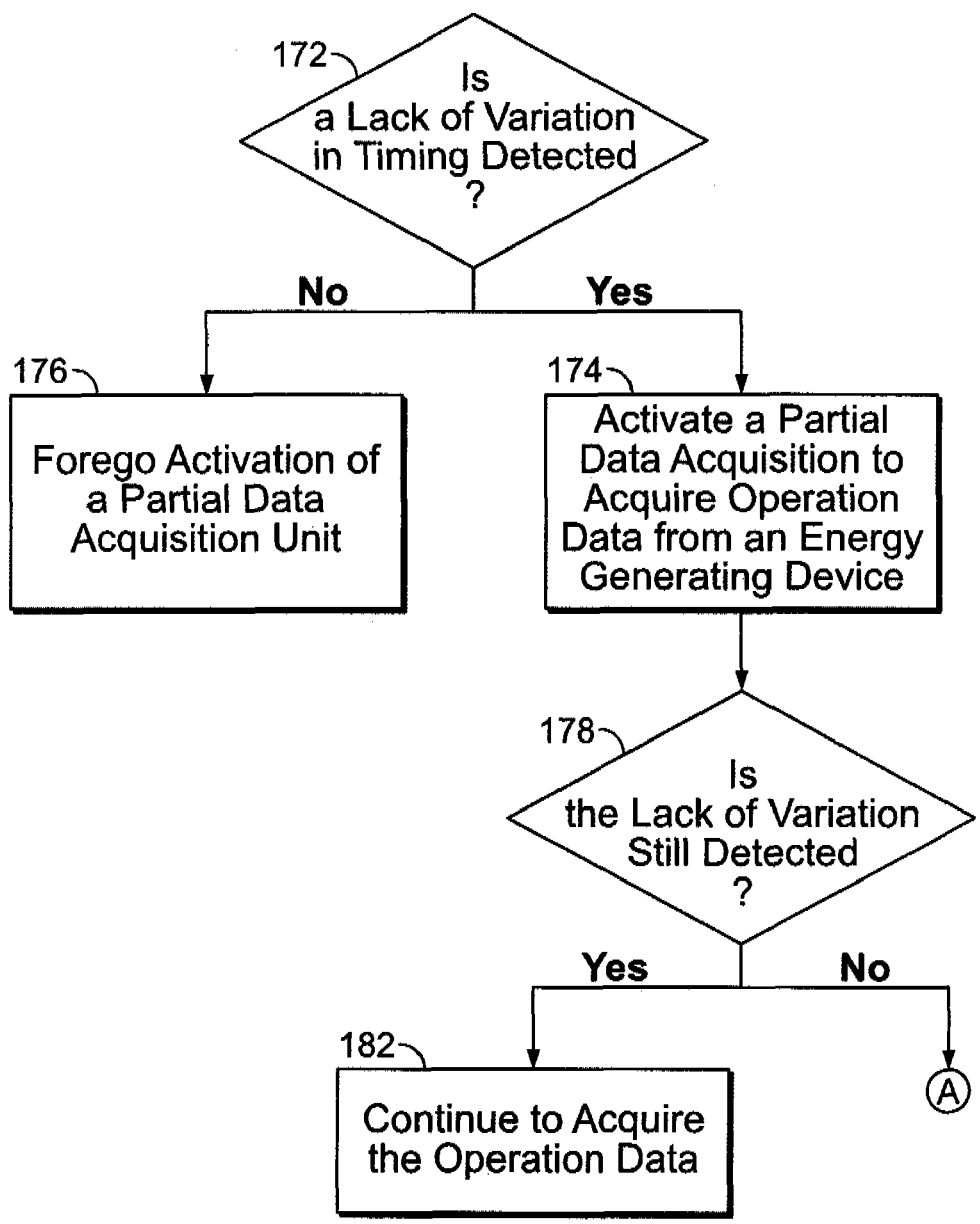
FIG. 5 is a flowchart of a method for triggering a partial discharge acquisition.
Figure 6:
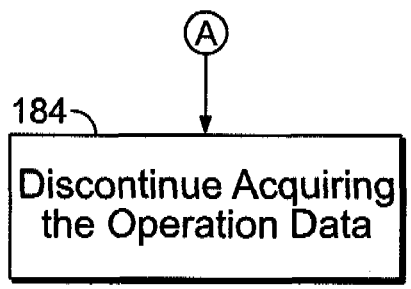
FIG. 6 is a continuation of the flowchart of FIG. 5.

FIGS. 5 and 6 are a flowchart of a method for triggering a PDA from EGD 12. Processor 22 detects 172 a lack of variation in timing from either present flux density trace 104 of from a comparison between present flux density trace 104 and prior flux density trace 154. Processor 22 detects 172 the lack of variation from present flux density trace 104 by determining that an amount of time displacement between one of the oscillations S1, S2, S3, S4, S5, S6, T1, T2, T3, T4, T5, and T6 located within pole X leading portion 110 and any one of the remaining oscillations within pole X leading portion 110 is equal to a time displacement between one of the oscillations S1, S2, S3, S4, S5, S6, T1, T2, T3, T4, T5, and T6 within pole Y leading portion 114 and any one of the remaining oscillations within pole Y leading portion 114. For example, processor 22 detects the lack of variation by determining that an amount of time displacement between the oscillations S1 and S6 within pole X leading portion 110 is equal to a time displacement between the oscillations S1 and S6 within pole Y leading portion 114. As another example, processor 22 detects the lack of variation by determining that an amount of time displacement between the oscillations S2 and T6 within pole X leading portion 110 is equal to a time displacement between the oscillations S2 and T6 within pole Y leading portion 114. Alternatively, processor 22 detects an existence of the variation from present flux density trace 104 by determining that an amount of time displacement between one of the oscillations S1, S2, S3, S4, S5, S6, T1, T2, T3, T4, T5, and T6 located within pole X leading portion 110 and any one of the remaining oscillations within pole X leading portion 110 is unequal to a time displacement between one of the oscillations S1, S2, S3, S4, S5, S6, T1, T2, T3, T4, T5, and T6 within pole Y leading portion 114 and any one of the remaining oscillations within pole Y leading portion 114.

In an alternative embodiment, processor 22 detects 172 the lack of variation by determining that an amount of time displacement between one of a plurality of oscillations, shown in FIG. 3, produced from a lagging edge of the pole X and any one of the remaining oscillations produced from the lagging edge of the pole X is equal to a time displacement between one of a plurality of oscillations, shown in FIG. 3, produced from a lagging edge of the pole Y and any one of the remaining oscillations of the lagging edge of the pole Y. The lagging edge of the pole X is located from pole axis 62 to quadrature axis 65 and the lagging edge of the pole Y is located from pole axis 62 to quadrature axis 65. In another alternative embodiment, processor 22 detects an existence of the variation by determining that an amount of time displacement between one of a plurality of oscillations, shown in FIG. 3, produced from the lagging edge of the pole X and any one of the remaining oscillations produced from the lagging edge of the pole X is unequal to a time displacement between one of a plurality of oscillations, shown in FIG. 3, produced from the lagging edge of the pole Y and any one of the remaining oscillations of the lagging edge of the pole Y.

In yet another alternative embodiment, processor 22 detects 172 the lack of variation from present flux density trace 104 by dividing an area under pole X leading portion 110 from the oscillation T6 to the oscillation S1 within group 86 into a series of segments and an area under pole Y leading portion 114 from the oscillation T6 to the oscillation S1 within group 88 into the series of segments. An example of a number of the segments includes 20. Another example of the number of the segments includes a number at least twice a number of field windings 51-56 in one of the poles X and Y. Processor 22 designates pole X leading sequence numbers, such as ranging from 1 to 20, in an increasing order from left to right along x-axis 84 to the segments within pole X leading portion 110. Processor 22 also designates pole Y leading sequence numbers, such as ranging from 1 to 20, in the increasing order from left to right along x-axis 84 to the segments within pole Y leading portion 114. When processor 22 determines that a pole X leading sequence number of one of the segments designated by one of the pole X leading sequence numbers and in which present time 106 occurs is equal to a pole Y leading sequence number of one of the segments designated by one of the pole Y leading sequence numbers and in which present time 108 occurs, processor 22 determines that there is the lack of variation in timing. When processor 22 determines that a pole X leading sequence number of one of the segments designated by one of the pole X leading sequence numbers and in which present time 106 occurs is unequal to a pole Y leading sequence number of one of the segments designated by one of the pole Y leading sequence numbers and in which present time 108 occurs, processor 22 determines that there is the variation in timing.

In still another alternative embodiment, processor 22 determines the lack of variation and/or an existence of the variation from present flux density trace 104 in a similar manner as that described above with reference to pole X leading portion 110 and pole Y leading portion 114 except that processor 22 starts by dividing an area under pole X lagging portion 112 generated by sensing electromagnetic energy from field windings 51-56 closer to the lagging edge of the pole X than to the leading edge of the pole X. Processor 22 determines the lack of variation and/or an existence of the variation from present flux density trace 104 in the similar manner except that processor 22 divides an area under pole Y lagging portion 116 generated by sensing electromagnetic energy from field windings 51-56 closer to the lagging edge of the pole Y than to the leading edge of the pole Y.

Processor 22 detects 172 the lack of variation in timing from the comparison between present flux density trace 104 and prior flux density trace 154 by determining that an amount of time displacement between one of the oscillations S1, S2, S3, S4, S5, S6, T1, T2, T3, T4, T5, and T6 located within pole X leading portion 110 and any one of the remaining oscillations within pole X leading portion 110 is equal a time displacement between one of the oscillations S1, S2, S3, S4, S5, S6, T1, T2, T3, T4, T5, and T6 within pole X leading portion 162 and any one of the remaining oscillations within pole X leading portion 162. For example, processor 22 detects the lack of variation by determining that an amount of time displacement between the oscillations S3 and S6 within pole X leading portion 110 is equal to a time displacement between the oscillations S3 and S6 within pole X leading portion 162. As another example, processor 22 detects the lack of variation by determining that an amount of time displacement between the oscillations S4 and T6 within pole X leading portion 110 is equal to a time displacement between the oscillations S4 and T6 within pole X leading portion 162. Alternatively, processor 22 detects an existence of the variation in timing from the comparison between present flux density trace 104 and prior flux density trace 154 by determining that an amount of time displacement between one of the oscillations S1, S2, S3, S4, S5, S6, T1, T2, T3, T4, T5, and T6 located within pole X leading portion 110 and any one of the remaining oscillations within pole X leading portion 110 is unequal to a time displacement between one of the oscillations S1, S2, S3, S4, S5, S6, T1, T2, T3, T4, T5, and T6 within pole X leading portion 162 and any one of the remaining oscillations within pole X leading portion 162.

In an alternative embodiment, processor 22 detects 172 the lack of variation by determining that an amount of time displacement between one of the plurality of oscillations, shown in FIG. 3, produced from the lagging edge of the pole X and any one of the remaining oscillations produced from the lagging edge of the pole X is equal to a time displacement between one of a plurality of oscillations, shown in FIG. 4, produced from the lagging edge of the pole Y and any one of the remaining oscillations of the lagging edge of the pole Y. In another alternative embodiment, processor 22 detects an existence of the variation by determining that an amount of time displacement between one of the plurality of oscillations, shown in FIG. 3, produced from the lagging edge of the pole X and any one of the remaining oscillations produced from the lagging edge of the pole X is unequal to a time displacement between one of a plurality of oscillations, shown in FIG. 4, produced from the lagging edge of the pole Y and any one of the remaining oscillations of the lagging edge of the pole Y.

In yet another alternative embodiment, processor 22 detects 172 the lack of variation from the comparison between present flux density trace 104 and prior flux density trace 154 by dividing an area under pole X leading portion 110 from the oscillation T6 to the oscillation S1 within group 86 into the series of segments and pole X leading portion 162 of prior flux density trace 154 from the oscillation T6 to the oscillation S1 within group 136 into the series of segments. Processor 22 designates the pole X leading sequence numbers, such as ranging from 1 to 20, in an increasing order from left to right along x-axis 84 to the segments within pole X leading portion 110. Processor 22 also designates a plurality of pole X leading sequence numbers, such as ranging from 1 to 20, in the increasing order from left to right along x-axis 134 to the segments within pole X leading portion 162. When processor 22 determines that a pole X leading sequence number of one of the segments that is designated by one of the pole X leading sequence numbers and in which present time 106 occurs is equal to a pole X leading sequence number of one of the segments that is designated by one of the pole X leading sequence numbers and in which prior time 156 occurs, processor 22 determines that there is the lack of variation in timing. When processor 22 determines that a pole. X leading sequence number of one of the segments that is designated by one of the pole X leading sequence numbers and in which present time 106 occurs is unequal to a pole X leading sequence number of one of the segments that is designated by one of the pole X leading sequence numbers and in which prior time 156 occurs, processor 22 determines that there is the variation in timing.

In still another alternative embodiment, processor 22 determines the lack of variation and/or an existence of the variation from the comparison in an equivalent manner that described above with reference to pole X leading portion 110 and pole X leading portion 162 except that processor 22 starts by dividing an area under pole X lagging portion 112. Processor 22 determines the lack of variation and/or an existence of the variation from the comparison in the equivalent manner except that processor 22 divides an area in pole X lagging portion 164 generated by sensing electromagnetic energy from field windings 51-56 closer to the lagging edge of the pole X than to the leading edge of the pole X.

Processor 22 activates 174 PDA unit 14 upon determining the lack of variation by sending processor output signal 32 to PDA unit 14. In an alternative embodiment, processor 22 activates 174 PDA unit 14 by closing a switch (not shown), such as a transistor. When the switch is closed, a voltage source (not shown) provides power to energize PDA unit 14. In another alternative embodiment, processor 22 activates 174 PDA unit 14 upon detecting the lack of variation for a pre-specified period of time, such as ranging from two hours to 24 hours of operation of rotor 42.

Processor 22 foregoes 176 the activation of PDA unit 14 upon detecting the variation. Processor 22 foregoes 176 the activation of PDA unit 14 by not sending processor output signal 32 to PDA unit 14. In an alternative embodiment, processor 22 foregoes 176 the activation of PDA unit 14 by opening the switch.

When PDA unit 14 is activated, processor 22 continues 178 to detect whether the lack of variation exists. When PDA unit 14 is activated and upon detection by processor 22 of the lack of variation, PDA unit 14 continues 182 to acquire operation data 34 from EGD 12. When PDA unit 14 is activated and upon detection by processor 22 that the variation exists, processor 22 sends processor output signal 32 indicating PDA unit 14 to discontinue 184 acquiring operation data 34 from EGD 12. In an alternative embodiment, when PDA unit 14 is activated and upon detection by processor 22 that the variation exists, processor 22 opens the switch to deactivate PDA unit 14 from acquiring operation data 34. Upon receiving processor output signal 32 indicating to discontinue acquiring operation data 34 from EGD 12, PDA unit 14 discontinues 184 acquiring operation data 34 from EGD 12. It is noted that the method for triggering a PDA is performed when EGD 12 is operating at a constant load capacity, such as, 10% load capacity, 20% load capacity, 50% load capacity, or 100% load capacity of load 16.

Technical effects of the herein describes systems and methods for triggering a PDA include saving memory space used in storage device 26 to store operation data 34. The saving is performed, for instance, by activating PDA unit 14 upon detection by processor 22 of the lack of variation and deactivating PDA unit 14 upon detection by processor 22 of an existence of the variation. Moreover, efficiency and life of PDA unit 14 increases because PDA unit 14 is activated upon detecting the lack of variation and deactivated upon detecting an existence of the variation.

While the invention has been described in terms of various specific embodiments, those skilled in the art will recognize that the invention can be practiced with modification within the spirit and scope of the claims.

What is claimed is:

1. A method for triggering a partial discharge acquisition from an energy generating device, said method comprising:
   generating a power source sensed signal by sensing electromagnetic energy output from the energy generating device;
   producing a present flux density trace from the power source sensed signal;
   determining a lack of variation in timing from at least one of the present flux density trace and a comparison between the present flux density trace and at least one prior flux density trace; and
   activating a partial discharge acquisition unit when the lack of variation is determined.

2. A method in accordance with claim 1 wherein said determining a lack of variation comprises determining the lack of variation from the present flux density trace generated during a rotation of the energy generating device.

3. A method in accordance with claim 1 wherein said determining a lack of variation comprises determining the lack of variation from the comparison of the present flux density trace generated during a rotation of the energy generating device as the energy generating device is presently operating and the prior flux density trace generated during a rotation of the energy generating device during a previous operation of the energy generating device.

4. A method in accordance with claim 1 further comprising activating a partial discharge data acquisition from the energy generating device upon detecting the lack of variation.

5. A method in accordance with claim 1 further comprising:
   activating a partial discharge data acquisition from the energy generating device upon detecting the lack of variation; and
   analyzing partial discharge data acquired from the partial discharge data acquisition.

6. A method in accordance with claim 1 further comprising foregoing activation of a partial discharge data acquisition from the energy generating device upon detecting the variation.

7. A method in accordance with claim 1 wherein said determining a lack of variation comprises determining the lack of variation over a pre-specified period of time.

8. A method in accordance with claim 1 wherein said determining a lack of variation from the present flux density trace comprises determining a lack of a change in a time displacement at which the present flux density trace has a pre-determined trace value during a rotation of the energy generating device.

9. A method in accordance with claim 1 wherein said determining a lack of variation from the comparison comprises determining that there is a lack of difference between a present time displacement at which the present flux density trace has a pre-determined trace value and a prior time displacement at which the prior flux density trace has the pre-determined trace value.

10. A method in accordance with claim 1 wherein said method is performed at a time during which the energy generating device supplies power to a load.

11. A system for triggering a partial discharge acquisition from an energy generating device, said system comprising:
    a sensor configured to generate a power source sensed signal by sensing electromagnetic energy output from the energy generating device;
    a processor configured to produce a present flux density trace from the power source sensed signal, said processor configured to detect a lack of variation in timing from at least one of the present flux density trace and a comparison between the present flux density trace and a prior flux density trace; and
    a partial discharge acquisition unit that is activated by said processor when said processor detects the lack of variation.

12. A system in accordance with claim 11 wherein said processor is further configured to detect a lack of variation from the present flux density trace generated during a rotation of the energy generating device.

13. A system in accordance with claim 11 wherein said processor is further configured to detect the lack of variation from the comparison between the present flux density trace generated during a present rotation of the energy generating device and the prior flux density trace generated during a prior rotation of the energy generating device.

14. A system in accordance with claim 11 wherein said processor is further configured to activate a partial discharge data acquisition from the energy generating device upon detecting the lack of variation.

15. A system in accordance with claim 11 wherein said processor is further configured to activate a partial discharge data acquisition from the energy generating device upon detecting the lack of variation, and said system comprising an analyzer configured to analyze partial discharge data acquired from the partial discharge data acquisition.

16. A system in accordance with claim 11 wherein said processor is further configured to forego activation of a partial discharge data acquisition from the energy generating device upon detecting the variation.

17. A system in accordance with claim 11 wherein said processor is further configured to detect the lack of variation over a pre-specified period of time.

18. A system accordance with claim 11 wherein said processor is further configured to detect the lack of variation from the present flux density trace by determining a lack of a change in a time displacement at which the present flux density trace has a pre-determined trace value during a rotation of the energy generating device.

19. A processor configured to activate a partial data acquisition unit based on a lack of variation in timing, the lack of variation generated from at least one of a present flux density trace and a comparison between the present flux density trace and a prior flux density trace.

20. A processor in accordance with claim 19 wherein said processor configured to:
  generate the prior flux density trace from a prior rotation of an energy generating device; and
  generate the present flux density trace from a present rotation of said energy generating device, the prior rotation occurring before the present rotation.

* * * * *